(12) United States Patent
Kim et al.

(10) Patent No.: US 10,892,313 B2
(45) Date of Patent: Jan. 12, 2021

(54) DISPLAY DEVICE

(71) Applicant: SAMSUNG DISPLAY CO., LTD., Yongin-si (KR)

(72) Inventors: Byoungyong Kim, Seoul (KR); Jonghyuk Lee, Seoul (KR); Jeongho Hwang, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 87 days.

(21) Appl. No.: 16/244,372

(22) Filed: Jan. 10, 2019

(65) Prior Publication Data

US 2019/0252481 A1 Aug. 15, 2019

(30) Foreign Application Priority Data

Feb. 14, 2018 (KR) .................. 10-2018-0018219

(51) Int. Cl.
*H01L 27/32* (2006.01)

(52) U.S. Cl.
CPC ...... *H01L 27/3276* (2013.01); *H01L 27/3248* (2013.01); *H01L 27/3258* (2013.01)

(58) Field of Classification Search
CPC ............. H01L 27/3276; H01L 27/3248; H01L 27/3258
See application file for complete search history.

(56) References Cited

U.S. PATENT DOCUMENTS

| 5,483,741 | A | * | 1/1996 | Akram | G01R 1/06738 29/846 |
| 7,102,240 | B2 | * | 9/2006 | Park | B81C 1/00238 257/778 |
| 8,674,367 | B2 | | 3/2014 | Park et al. | |
| 8,698,189 | B2 | | 4/2014 | Park et al. | |
| 9,640,598 | B2 | | 5/2017 | Park et al. | |
| 2002/0008529 | A1 | * | 1/2002 | Wilson | G01R 1/07314 324/756.03 |
| 2016/0228308 | A1 | | 8/2016 | Schmitz | |
| 2019/0181111 | A1 | * | 6/2019 | Kim | H01L 27/3255 |
| 2019/0220122 | A1 | * | 7/2019 | Shin | G06F 3/041 |

FOREIGN PATENT DOCUMENTS

| KR | 1020130007053 A | 1/2013 |
| KR | 1020150045330 A | 4/2015 |
| KR | 101822012 B1 | 1/2018 |

* cited by examiner

*Primary Examiner* — Seahvosh Nikmanesh
(74) *Attorney, Agent, or Firm* — Cantor Colburn LLP

(57) ABSTRACT

A display device includes: a substrate including a pad area; a plurality of first conductive pads disposed in a matrix form in the pad area in a first direction and in a second direction intersecting the first direction; protrusions disposed on the plurality of first conductive pads; and a plurality of second conductive pads disposed on the plurality of first conductive pads and the protrusions. The plurality of second conductive pads include: contact portions in contact with the first conductive pads; and raised portions configured to extend from the contact portions, to cover the protrusions, and to have heights greater than that of the contact portions. The plurality of second conductive pads include an ultrasonic bondable material.

21 Claims, 13 Drawing Sheets

* 250 : 251, 252

DISPLAY DEVICE

This application claims priority to Korean Patent Application No. 10-2018-0018219, filed on Feb. 14, 2018, and all the benefits accruing therefrom under 35 U.S.C. § 119, the content of which in its entirety is herein incorporated by reference.

BACKGROUND

1. Field

The disclosure relates to a display device in which a circuit member is stably bonded onto a display substrate.

2. Discussion of Related Art

A display device is typically classified into a liquid crystal display ("LCD") device, an organic light emitting diode ("OLED") display device, a plasma display panel ("PDP") device, and an electrophoretic display device according to the light emission method thereof.

A display device generally includes a display panel configured to display images and a circuit member configured to drive the display panel. The circuit member may be, e.g., a driver integrated circuit ("IC") or flexible printed circuit board ("FPCB"), and is mostly mounted on an edge of the display panel. Such a driver IC may be directly mounted on a display panel in a chip-on-glass ("COG") manner through an anisotropic conductive film ("ACF"), or may be mounted on a tape carrier package ("TCP") or flexible film in a chip-on-film (COF) manner, for example, and be connected to the display panel through an anisotropic conductive film.

SUMMARY

Recently, the resolution of a display device has become higher, the non-display area of the display device has been reduced, and the width and interval of wirings therein have become narrower. Accordingly, in such a display device, a circuit member may not be effectively or stably bonded onto a substrate.

The disclosure is directed to a display device in which a circuit member is stably bonded onto a display substrate.

According to an embodiment of the invention, a display device includes: a substrate including a pad area; a plurality of first conductive pads disposed in a matrix form in the pad area in a first direction and in a second direction intersecting the first direction; protrusions disposed on the plurality of first conductive pads; and a plurality of second conductive pads disposed on the plurality of first conductive pads and the protrusions, where the plurality of second conductive pads include: contact portions in contact with the first conductive pads; and raised portions extending from the contact portions, where the raised portions cover the protrusions, and have a height greater than a height of the contact portions; and the plurality of second conductive pads includes an ultrasonic bondable material.

In an embodiment, the plurality of second conductive pads may include at least one selected from aluminum (Al), silver (Ag), copper (Cu), molybdenum (Mo), chrome (Cr), tantalum (Ta), and titanium (Ti).

In an embodiment, the raised portions may have an area substantially equal to or greater than about 100 square micrometers ($\mu m^2$) when viewed from a plan view in a thickness direction of the substrate.

In an embodiment, the second conductive pads may have a thickness of about 6000 angstrom (A) or greater.

In an embodiment, the first conductive pads may be spaced apart from each other by a distance substantially equal to or longer than about 15 micrometers ($\mu m$).

In an embodiment, the second conductive pads may be spaced apart from each other by a distance substantially equal to or longer than about 15 $\mu m$.

In an embodiment, the first conductive pads may include at least one selected from aluminum (Al), silver (Ag), copper (Cu), molybdenum (Mo), chrome (Cr), tantalum (Ta), and titanium (Ti).

In an embodiment, the substrate may include: gate lines extending in the first direction; a gate insulating film disposed on the gate lines; and data lines disposed on the gate insulating film, and extending in the second direction, where the first conductive pads include a same material as the gate lines, the protrusions include a same material as the gate insulating film, and the second conductive pads include a same material as the data lines.

In an embodiment, the plurality of second conductive pads may be disposed in a zigzag form based on a center line of the plurality of first conductive pads adjacently disposed in the second direction.

In an embodiment, the plurality of second conductive pads disposed on one of the plurality of first conductive pads may be spaced apart from each other in the first direction.

In an embodiment, the raised portions may have a total area equal to or less than ½ of the area of the first conductive pads when viewed from a plan view in a thickness direction of the substrate.

In an embodiment, the raised portions may have a total area equal to or less than ⅓ of the area of the first conductive pads when viewed from a plan view in a thickness direction of the substrate.

In an embodiment, the display device may further include holes defined by the protrusions.

In an embodiment, at least a part of the protrusions may be disposed at a predetermined angle with the first direction when viewed from a plan view in a thickness direction of the substrate.

In an embodiment, the protrusions disposed on one of the plurality of first conductive pads may be integrated with each other.

In an embodiment, the contact portions may be surrounded by the protrusions and the raised portions when viewed from a plan view in a thickness direction of the substrate.

In an embodiment, the protrusions and raised portions may be surrounded by the contact portions when viewed from a plan view in a thickness direction of the substrate.

In an embodiment, the contact portions may extend in a zigzag form in the second direction.

In an embodiment, the contact portions may extend in a zigzag form in the first direction.

In an embodiment, the contact portions may have a width substantially equal to or greater than about 1 $\mu m$ and substantially equal to or less than about 5 $\mu m$.

In an embodiment, the contact portions may include a first contact portions and a second contact portion adjacent to each other, and the first contact portion may be spaced apart from the second contact portion by a distance substantially equal to or greater than about 1 $\mu m$ and substantially equal to or less than about 5 $\mu m$ when viewed from a plan view in a thickness direction of the substrate.

According to another embodiment of the invention, a display device includes: a substrate including a pad area;

first conductive pads disposed in a matrix form in the pad area in a first direction and in a second direction intersecting the first direction; protrusions disposed on the first conductive pads; second conductive pads disposed on the first conductive pads and the protrusions; and a circuit member including a bump electrically connected to the first conductive pads and the second conductive pads, where the second conductive pads include: contact portions in contact with the first conductive pads; and raised portions extending from the contact portions, where the raised portions cover the protrusions, and have a height greater than a height of the contact portions, and the plurality of second conductive pads include an ultrasonic bondable material.

In an embodiment, the second conductive pads may include at least one selected from aluminum (Al), silver (Ag), copper (Cu), molybdenum (Mo), chrome (Cr), tantalum (Ta), and titanium (Ti).

In an embodiment, the raised portions may be in contact with the bump.

In an embodiment, at least one of the contact portions may be in contact with the bump.

In an embodiment, the front surfaces of the second conductive pads may be in contact with the bump.

In an embodiment, the protrusions may be spaced apart from the bump at an interval of about 1 μm or greater.

In an embodiment, at least one of the raised portions may have an area of about 100 μm$^2$ or less when viewed from a plan view in a thickness direction of the substrate.

In an embodiment, the circuit member may include a driver integrated circuit ("IC") or a flexible printed circuit board ("FPCB").

In an embodiment, the first conductive pads may be spaced apart from each other by a distance of about 15 μm or greater when viewed from a plan view in a thickness direction of the substrate.

In an embodiment, the second conductive pads may be spaced apart from each other by a distance of about 15 μm or greater when viewed from a plan view in a thickness direction of the substrate.

In an embodiment, the first conductive pads may include at least one selected from aluminum (Al), silver (Ag), copper (Cu), molybdenum (Mo), chrome (Cr), tantalum (Ta), and titanium (Ti).

In an embodiment, the raised portions may overlap the protrusions and the first conductive pads.

In an embodiment, the substrate may include: gate lines extending in the first direction; a gate insulating film disposed on the gate lines; and data lines disposed on the gate insulating film, and extending in the second direction, where the first conductive pads may include the same material as the gate lines, the protrusions may include a same material as the gate insulating film, and the second conductive pads may include a same material as the data lines.

In an embodiment, the plurality of second conductive pads may be disposed in a zigzag form based on a center line of the plurality of first conductive pads adjacently disposed in the second direction.

In an embodiment, the plurality of second conductive pads on one of the plurality of first conductive pads may be spaced apart from each other in the first direction.

In an embodiment, the display device may further include an anisotropic conductive film disposed between the second conductive pads and the bump, where the anisotropic conductive film may electrically connect the second conductive pads and the bump.

In an embodiment, the raised portions may have a total area equal to or less than ½ of the area of the first conductive pads when viewed from a plan view in a thickness direction of the substrate.

In an embodiment, the raised portions may have a total area equal to or less than ⅓ of the area of the first conductive pads when viewed from a plan view in a thickness direction of the substrate.

In an embodiment, holes may be defined by the bump and the second conductive pads.

In an embodiment, the contact portions may be surrounded by the protrusions and the raised portions when viewed from a plan view in a thickness direction of the substrate.

In an embodiment, the protrusions and raised portions may be surrounded by the contact portions when viewed from a plan view in a thickness direction of the substrate.

In an embodiment, the contact portions may extend in a zigzag form in the second direction.

In an embodiment, the contact portions may extend in a zigzag form in the first direction.

In an embodiment, the contact portions may have a width substantially equal to or greater than about 1 μm and substantially equal to or less than about 5 μm.

In an embodiment, the contact portions may include a first contact portion and a second contact portion, and the first contact portion may be spaced apart from the second contact portion by a distance substantially equal to or greater than about 1 μm and substantially equal to or less than about 5 μm when viewed from a plan view in a thickness direction of the substrate.

According to another embodiment of the invention, a display device includes: a substrate including a pad area; first conductive pads disposed in the pad area; protrusions disposed on the first conductive pads; second conductive pads disposed on the first conductive pads and the protrusions; a circuit member including a bump bonded onto the second conductive pads; and bonded portions disposed between the second conductive pads and the bump, where the second conductive pads include: contact portions in contact with the first conductive pads; and raised portions extending from the contact portions, where the raised portions cover the protrusions, and have a height greater than a height of the contact portions, and the bonded portions include a material constituting the bump and a material constituting the second conductive pads.

In an embodiment, the bonded portions may be integrated with the raised portions and the bump.

In an embodiment, the bonded portions may be integrated with the contact portions.

In an embodiment, a portion of the bonded portions which overlap the protrusions may have a color different from a color of a portion of the bonded portions which do not overlap the protrusions.

In an embodiment, holes may be defined by the bump, the bonded portions, the contact portions, and the raised portions.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
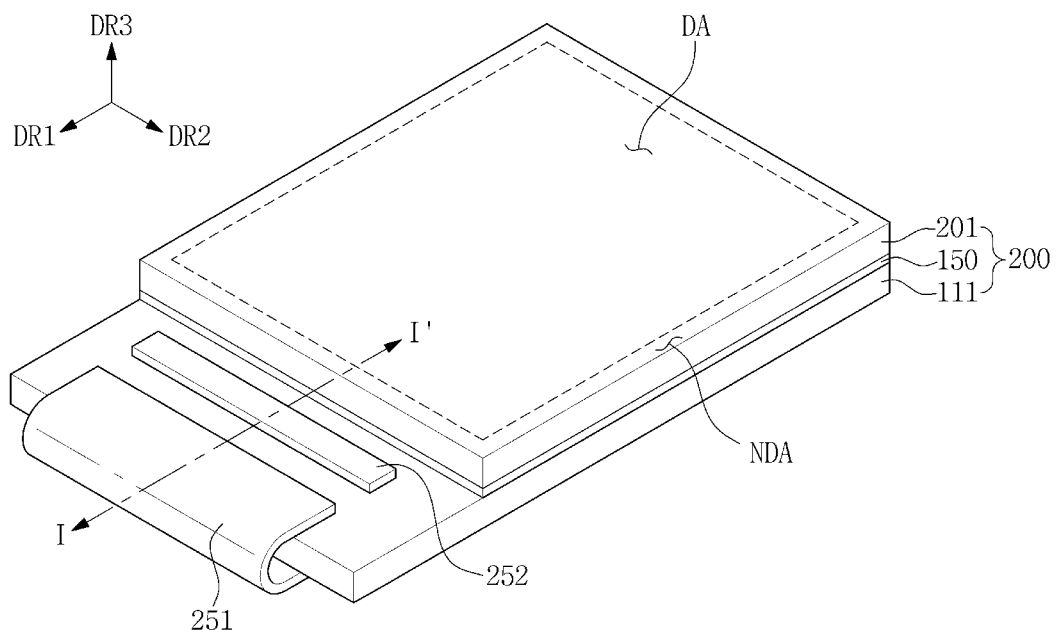
FIG. 1 is a perspective view of a display device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used herein are not intended to limit the disclosure, but are intended to illustrate exemplary embodiments. When any portion is described as being connected to another portion, this includes not only a case where they are "directly connected" to each other but also a case where they are "electrically connected" to each other with a third element interposed therebetween.

It will be understood that when an element is referred to as being "on" another element, it can be directly on the other element or intervening elements may be present therebetween. In contrast, when an element is referred to as being "directly on" another element, there are no intervening elements present.

Furthermore, in the following description, an organic light-emitting diode display device including an organic light-emitting layer will be described as an exemplary embodiment of a display device according to the disclosure for convenience of description, but the disclosure is not limited thereto. In exemplary embodiments, the display device may include a liquid crystal display device, a plasma display device, a field emission display device, etc.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the disclosure will be described in detail with reference to the accompanying drawings.

Figure 2:
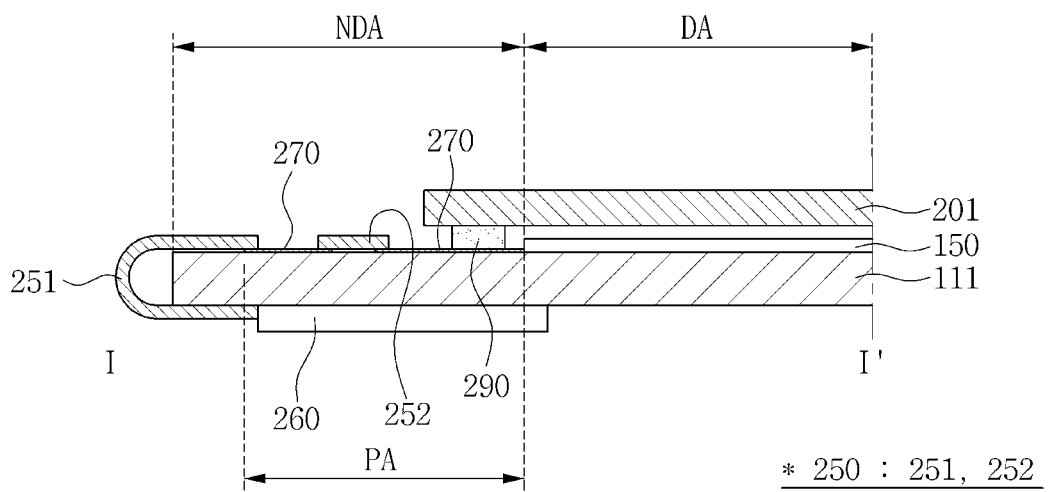
FIG. 2 is a cross-sectional view taken along line I-I' of FIG. 1.

FIG. 1 is a perspective view of a display device according to an exemplary embodiment of the disclosure, and FIG. 2 is a cross-sectional view taken along line I-I' of FIG. 1.

Referring to FIGS. 1 and 2, an exemplary embodiment of an organic light-emitting diode display device includes a display panel 200, a flexible printed circuit board ("FPCB") 251, a printed circuit board ("PCB") 260, and a driver integrated circuit ("IC") 252.

In an exemplary embodiment, the display panel 200 is a panel configured to display images, and may be an organic light-emitting diode panel. Alternatively, the display panel 200 may be any one of a liquid crystal display panel, an electrophoretic display panel, a light emitting diode ("LED") panel, an inorganic electro luminescent ("EL") display panel, a field emission display ("FED") panel, a surface conduction electron-emitter display ("SED") panel, a plasma display panel ("PDP"), and a cathode ray tube ("CRT") display panel. However, these are merely exemplary. Accordingly, in such an embodiment, one of all types of display panels which have been currently developed and commercialized or which can be implemented according to the future development of technology may be used as the display panel.

In an exemplary embodiment, as shown in FIGS. 1 and 2, the display panel 200 includes a substrate 111, an encapsulation substrate 201 disposed opposite to the substrate 111, a pixel part 150, and a sealing member 290. However, such an embodiment of the disclosure is not limited thereto. Alternatively, the substrate 111 may be encapsulated with a thin film encapsulation layer or the like, rather than the encapsulation substrate 201.

The substrate 111 includes a display area DA configured in a way such that an image is displayed thereon through light emission, and a non-display area NDA located outside the display area DA. A plurality of pixels is disposed in the display area DA of the substrate 111, and form the pixel part 150.

The non-display area NDA includes a pad area PA, and a plurality of pad wirings 270 configured to receive external signals for organic light-emitting diodes (OLEDs in FIG. 22) to emit light and to transfer the external signals to the organic light-emitting diodes is disposed in the pad area PA. In an exemplary embodiment, one or more driver IC 252 may be disposed in the pad area PA.

The pixel part 150 is disposed on the substrate 111, and includes organic light-emitting diodes and a wiring part configured to drive the organic light-emitting diodes. The wiring part of the pixel part 150 is connected to the driver IC 252. The pixel part 150 will be described later in greater detail with reference to FIGS. 20 to 22. Any devices, other than the organic light-emitting diodes, may be included in the pixel part 150 as long as they function as a display element of the display device.

The encapsulation substrate 201 is disposed opposite to the substrate 111, and is joined to the substrate 111 via the sealing member 290. The encapsulation substrate 201 covers and protects the pixel part 150. The encapsulation substrate 201 may have a smaller area than the substrate 111 when viewed from a plan view in a thickness direction of the substrate 111. Accordingly, the pad area PA of the substrate 111 may not overlap the encapsulation substrate 201, and thereby be exposed when viewed from the plan view in the thickness direction of the substrate 111.

In an exemplary embodiment, a polarizing plate (not shown) may be disposed on the encapsulation substrate 201. The polarizing plate effectively prevents external light from being reflected.

In an exemplary embodiment, a common material, such as sealing glass frit, may be used as the sealing member 290.

The PCB 260 is a circuit substrate configured to provide drive signals to the display panel 200. The PCB 260 may include a timing controller (not shown) configured to generate control signals to drive the display panel 200 and a power voltage generation unit (not shown) configured to generate power voltage, for example.

In an exemplary embodiment, the PCB 260 may be disposed on a surface of the display panel 200. In one exemplary embodiment, for example, the PCB 260 may be disposed on a bottom surface of the display panel 200. Generally, the display panel 200 displays images on a top surface of the display panel 200, and thus the bottom surface of the display panel 200 is an area which may not be viewed by a user. Accordingly, in such an embodiment, the PCB 260 may be disposed on the back surface of the display panel 200 to maximize spatial efficiency and to hide components which is not desired to be viewed by a user. However, this is merely exemplary. Alternatively, the PCB 260 may be disposed on a side surface of the display panel 200, or the PCB 260 may be integrated with the FPCB 251.

According to an exemplary embodiment of the disclosure, a circuit member 250 may include the FPCB 251 and the driver IC 252. The circuit member 250 may be in direct contact with the pad wiring 270 of the pad area PA, or electrically connected to the pad wiring 270 of the pad area PA by an anisotropic conductive film (310 of FIG. 19). This will be described later in greater detail with reference to FIGS. 16 to 19.

The FPCB 251 may be electrically connected to the display panel 200 and the PCB 260, and may provide an electrical connection between the display panel 200 and the PCB 260. The FPCB 251 may be in direct contact with the pad wiring 270 of the pad area PA, or may be connected to the pad wiring 270 of the pad area PA by the anisotropic conductive film 310. In one exemplary embodiment, for example, the circuit member 250 may be in direct contact with the pad wiring 270 of the pad area PA, and may be electrically connected by ultrasonic bonding.

Although not shown in the drawings, the FPCB 251 may include a base film and a wiring pattern disposed on the base film in terms of a sectional structure, and may further include a cover film disposed on the wiring pattern.

The base film and the cover film may be films which include a material having high flexibility, high insulation, and high heat resistance. In one exemplary embodiment, for example, the base film and the cover film may include polyimide, but are not limited thereto.

A wiring pattern may be disposed between the base film and the cover film. The wiring pattern is configured to transfer predetermined electrical signals. The wiring pattern may include a metal material, such as copper (Cu), and the surface of copper may be plated with tin, silver, nickel, etc.

The driver IC 252 may be in direct contact with the pad wiring 270 of the pad area PA, or may be electrically connected to the pad wiring 270 of the pad area PA by the anisotropic conductive film 310. The driver IC 252 may be an integrated circuit chip, such as a driver IC. In one exemplary embodiment, for example, the circuit member 250 may be in direct contact with and electrically connected to the pad wiring 270 of the pad area PA by ultrasonic bonding.

Figure 3:
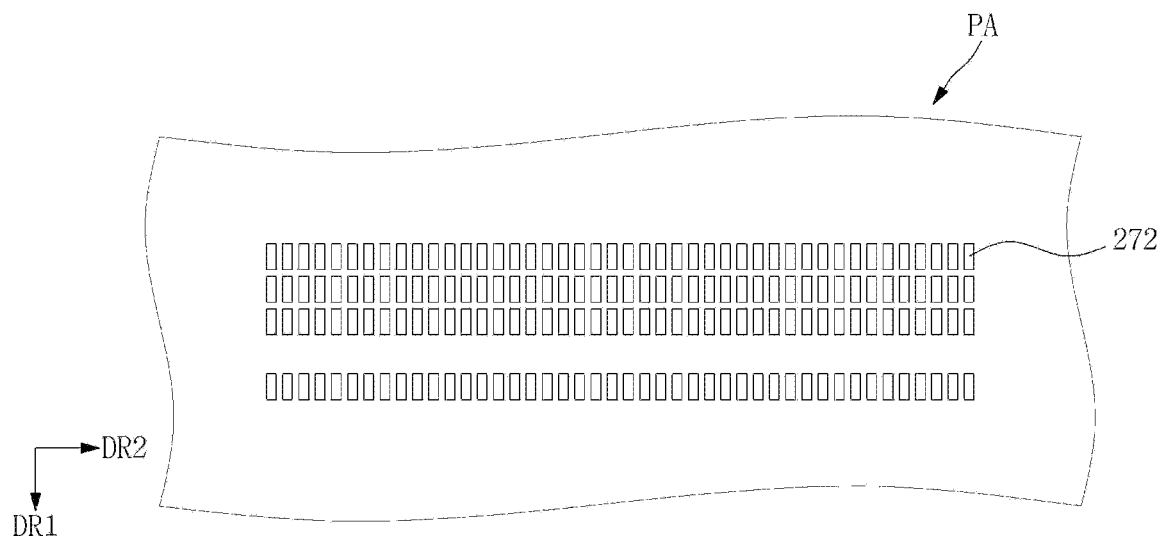
FIG. 3 is a plan view showing part of a pad area according to an exemplary embodiment of the disclosure.
Figure 4:
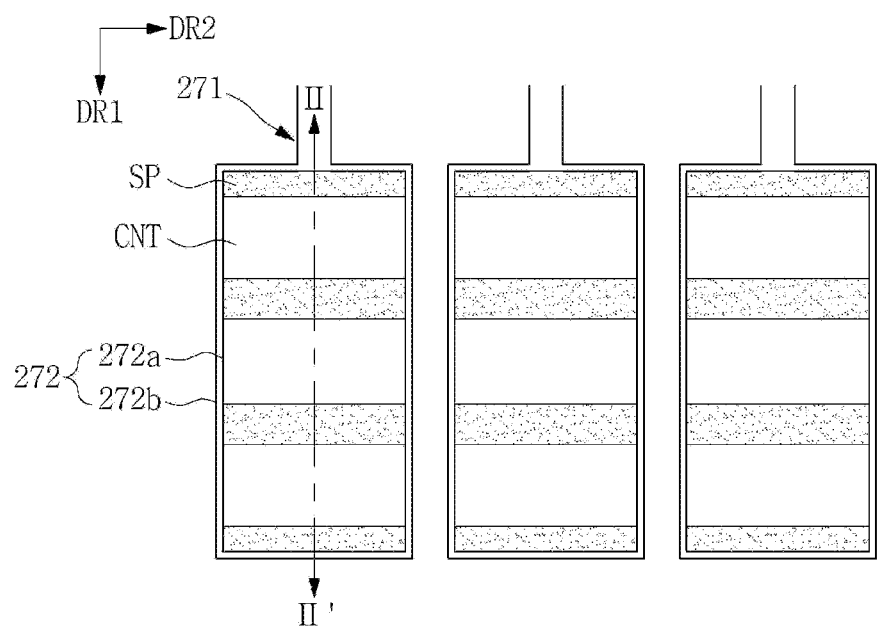
FIG. 4 is a plan view of conductive pads according to an exemplary embodiment of the disclosure.
Figure 5:
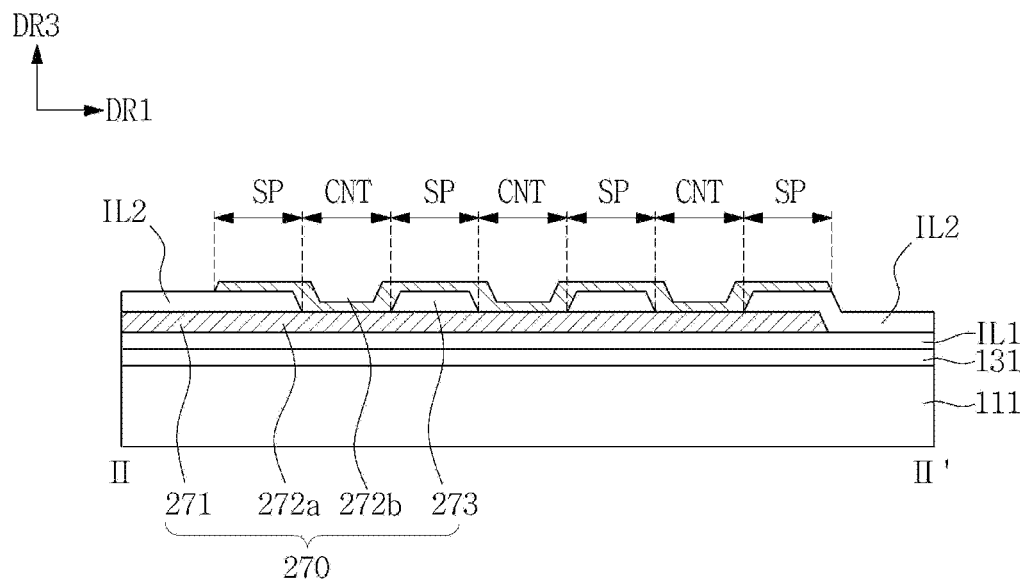
FIG. 5 is a cross-sectional view taken along line II-IF of FIG. 4.

FIG. 3 is a plan view showing part of a pad area according to an exemplary embodiment of the disclosure, FIG. 4 is a plan view of conductive pads according to an exemplary embodiment of the disclosure, and FIG. 5 is a cross-sectional view taken along line II-IF of FIG. 4.

Referring to FIGS. 3 and 4, the pad wiring 270 includes a thin film wiring 271 extending from the pixel part 150, and a plurality of conductive pads 272 located on an end portion of the thin film wiring 271. The pad wiring 270 is disposed in the pad area PA of the substrate 111. In an exemplary embodiment, the conductive pads 272 may be arranged in a matrix form in a first direction DR1 or second direction DR2.

The thin film wiring 271 extends from the wiring part 130 of the pixel part 150 to the conductive pads 272, and electrically connects the pixel part 150 and the conductive pads 272 to each other.

The conductive pads 272 are disposed to correspond to the bumps 254 of the circuit member 250. The conductive pads 272 may be in direct contact with bumps 254 (shown in FIGS. 16 to 19) of the circuit member 250, or may be electrically connected to the bumps 254 of the circuit member 250 by the anisotropic conductive film 310.

Referring to FIGS. 4 and 5, the conductive pads 272 include a plurality of first conductive pads 272a and a plurality of second conductive pads 272b.

The first conductive pads 272a are disposed on the substrate 111. In an exemplary embodiment, the first conductive pads 272a may be disposed on a buffer layer 131 and a first insulating layer ILL However, the invention is not limited thereto, and alternatively, the buffer layer 131 may be omitted.

In an exemplary embodiment, as shown in FIG. 4, the first conductive pads 272a extend from the thin film wiring 271 connected to the wiring part 130 of the pixel part 150. The first conductive pads 272a may have a greater width than the thin film wiring 271 when viewed from a plan view in a third direction DR3 or in a thickness direction of the substrate 111.

In an exemplary embodiment, as shown in FIG. 4, the first conductive pads 272a may be spaced apart from each other, and may be arranged in a matrix form in the first direction DR1 or second direction DR2.

The first conductive pads 272a may be in rectangular shapes. However, the first conductive pads 272a are not limited thereto. In such an embodiment, the first conductive pads 272a may have a shape corresponding to that of the bumps 254 of the circuit member 250.

Figure 21:
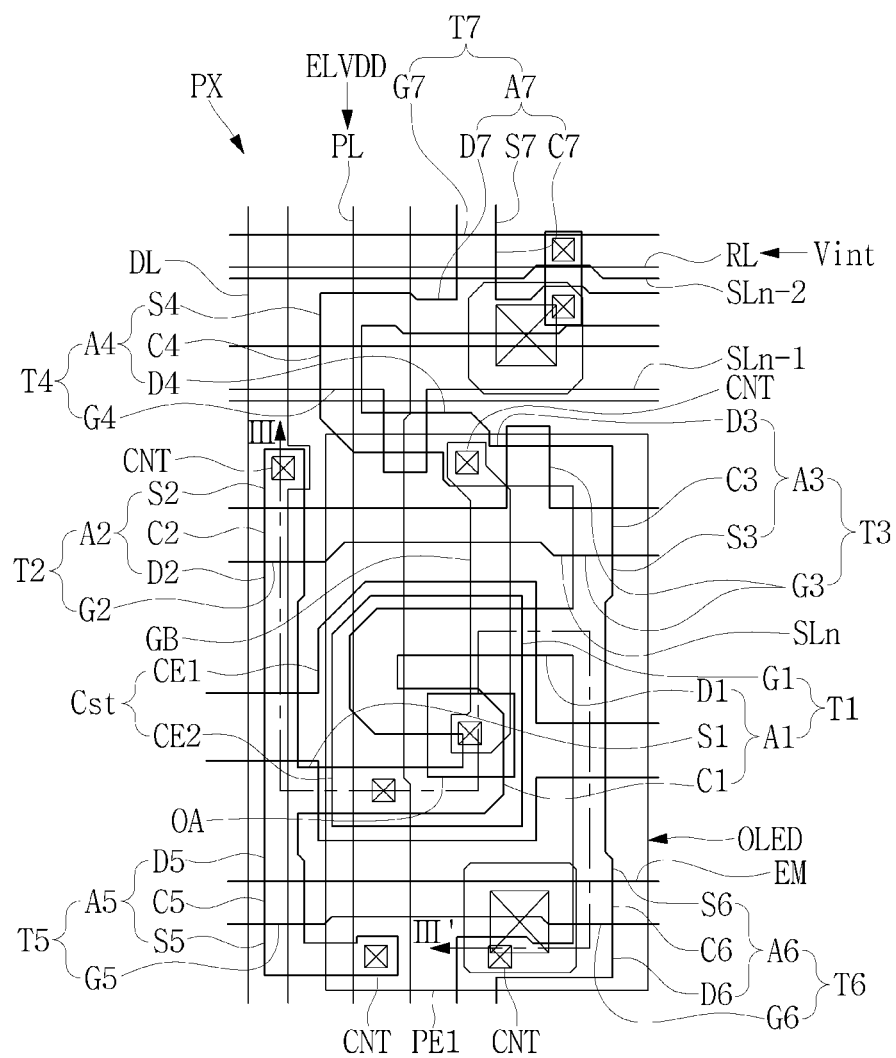
FIG. 21 is a plan view of the pixel of the display device according to an exemplary embodiment of the disclosure.

The first conductive pads 272a may include a same material as a data line (DLs of FIG. 21). In one exemplary embodiment, for example, the first conductive pads 271a may include an aluminum-based metal such as aluminum Al or an aluminum alloy, a silver-based metal such as sliver Ag or a silver alloy, a copper-based metal such as copper Cu or a copper alloy, or a molybdenum-based metal such as molybdenum Mo or a molybdenum alloy. Alternatively, the first conductive pads 271a may include at least one selected from chrome Cr, tantalum Ta, and titanium Ti. Alternatively, the first conductive pads 271a may have a multi-film structure including at least two conductive films having different physical properties from each other.

In an exemplary embodiment, as shown in FIG. 5, a plurality of protrusions 273 is disposed on the first conductive pads 272a. The protrusions 273 overlap the first conductive pads 272a and the second conductive pads 272b to be described later. In such an embodiment, the protrusions 273 are disposed between the first conductive pads 272a and the second conductive pads 272b. In such an embodiment, the protrusions 273 are disposed to overlap the raised portions SP of the first conductive pads 272a and the second conductive pads 272b.

According to an exemplary embodiment of the disclosure, the plurality of protrusions 273 may be spaced apart from each other. In one exemplary embodiment, for example, as shown in FIGS. 4 and 5, the plurality of protrusions 273 may be spaced apart from each other with a substantially constant distance or interval. However, the disclosure is not limited thereto, and alternatively, the plurality of protrusions 273 may be space apart from each other with different distances.

The plurality of protrusions 273 may define holes therebetween. In such an embodiment, the first conductive pads 272a and the second conductive pads 272b contact with each other via such holes, thereby forming contact portions CNT to be described later.

The protrusions 273 may include a same material as a second insulating layer (IL2 of FIG. 22) disposed in the display area DA. In an exemplary embodiment, the protrusions 273 and the second insulating layer IL2 may be provided or formed simultaneously during a same manufacturing process. Accordingly, the protrusions 273 may extend from and be integrated with the second insulating layer IL2.

Referring to FIGS. 4 and 5, the second conductive pads 272b are disposed on the first conductive pads 272a and the protrusions 273. In such an embodiment, the second conductive pads 272b are disposed on the first conductive pads 272a and the protrusions 273 to overlap the first conductive pads 272a.

As shown in the drawings, the second conductive pads 272b may have smaller areas than the first conductive pads 272a when viewed from the plan view in the third direction DR3. However, the exemplary embodiment of the disclosure is not limited thereto. Alternatively, the second conductive pads 272b may have substantially a same area as the first conductive pads 272a when viewed from the plan view in the third direction DR3, or may have larger areas than the first conductive pads 272a when viewed from the plan view in the third direction DR3.

In an exemplary embodiment, the second conductive pads 272b may include portions overlapping the protrusions 273, and portions not overlapping the protrusions 273 when viewed from the plan view in the third direction DR3. In such an embodiment, the portions overlapping the protrusions 273 are defined as raised portions SP, and the portions not overlapping the protrusions 273 are defined as contact portions CNT.

The raised portions SP may be disposed on the first conductive pads 272a and the protrusions 273. In an exemplary embodiment, the raised portions SP are disposed on the first conductive pads 272a and the protrusions 273, and have shapes protruding from the contact portions CNT in the third direction DR3. Accordingly, the raised portions SP have a height greater than that of the contact portions CNT. Herein, a height of the raised portions SP or the contact portions CNT may be defined as a distance between an upper surface thereof and an upper surface of the substrate 111 in the third direction DR3.

The raised portions SP may cover the protrusions 273. In an exemplary embodiment, the protrusions 273 are disposed between the raised portions SP and the first conductive pads 272a.

According to an exemplary embodiment of the disclosure, a plurality of raised portions SP of the second conductive pads 272b may be disposed on each of the first conductive pads 272a. In such an embodiment, a plurality of protrusions 273 may be disposed on each of the first conductive pads 272a, and the second conductive pads 272b is disposed on the plurality of protrusions 273 in a way such that portions of the second conductive pads 272b disposed on the protrusions 273 define the raised portions SP.

According to an exemplary embodiment of the disclosure, the total area of the plurality of raised portions SP disposed on each of the first conductive pads 272a is substantially equal to or greater than about 100 square micrometers ($\mu m^2$) when viewed from the plan view in the third direction DR3. For each of the conductive pads 270 to be electrically connected to a corresponding one of the bumps 254, the conductive pad 270 and the bump 254 are desired to have a bonding area of about 100 $\mu m^2$ or greater. In one exemplary embodiment, for example, where the raised portions SP are bonded on the bump 254 by ultrasonic bonding, the raised portions SP have an area substantially equal to or greater than about 100 $\mu m^2$ such that the raised portions SP may be effectively bonded onto the bump 254 by frictional force during ultrasonic bonding.

According to an exemplary embodiment of the disclosure, the raised portions SP may have a total area equal to or less than ½ of the area of the first conductive pad 272a when viewed from the plan view in the third direction DR3. In one exemplary embodiment, for example, where the raised portions SP are bonded on the bump 254 by ultrasonic bonding, pressure for the ultrasonic bonding applied to the overall area of the first conductive pads 272a or second conductive pads 272b is applied to the raised portions SP having a total area equal to or less than ½ of the area of the first conductive pad 272a. Accordingly, in such an embodiment, the magnitude of pressure applied to each area by ultrasonic bonding is increased, and thus the raised portions SP and the bump 254 may be stably connected to each other.

The contact portions CNT are disposed on the first conductive pad 272a. In an exemplary embodiment, the contact portions CNT are disposed in the holes defined by the plurality of protrusions 273, and in direct contact with the first conductive pad 272a.

According to an exemplary embodiment of the disclosure, the contact portions CNT may have a total area equal to or greater than ½ of the area of the first conductive pad 272a when viewed from the plan view in the third direction DR3.

The second conductive pads 272b may include a same material as the data line DL to be described later. In one exemplary embodiment, for example, the second conductive pads 272b may include an aluminum-based metal such as aluminum (Al) or an aluminum alloy, a silver-based metal such as silver (Ag) or a silver alloy, a copper-based metal such as copper (Cu) or a copper alloy, or a molybdenum-based metal such as molybdenum (Mo) or a molybdenum alloy. Alternatively, the pad wiring may include at least one selected from chrome (Cr), tantalum (Ta) and titanium (Ti). Alternatively, the second conductive pads 272b may have a multi-film structure including at least two conductive films different physical properties from each other. In one exemplary embodiment, for example, the second conductive pads 272b may include a Ti/Al/Ti alloy. In such an embodiment, the second conductive pads 272b may have a thickness of about 6000 angstrom (Å).

Hereinafter, alternative exemplary embodiments of a display device will be described in detail with reference to FIG. 6. The same or like elements shown in FIG. 6 have been labeled with the same reference characters as used above to describe the exemplary embodiments of the display device shown in FIGS. 1 to 5, and any repetitive detailed description thereof will hereinafter be omitted or simplified.

Figure 6:
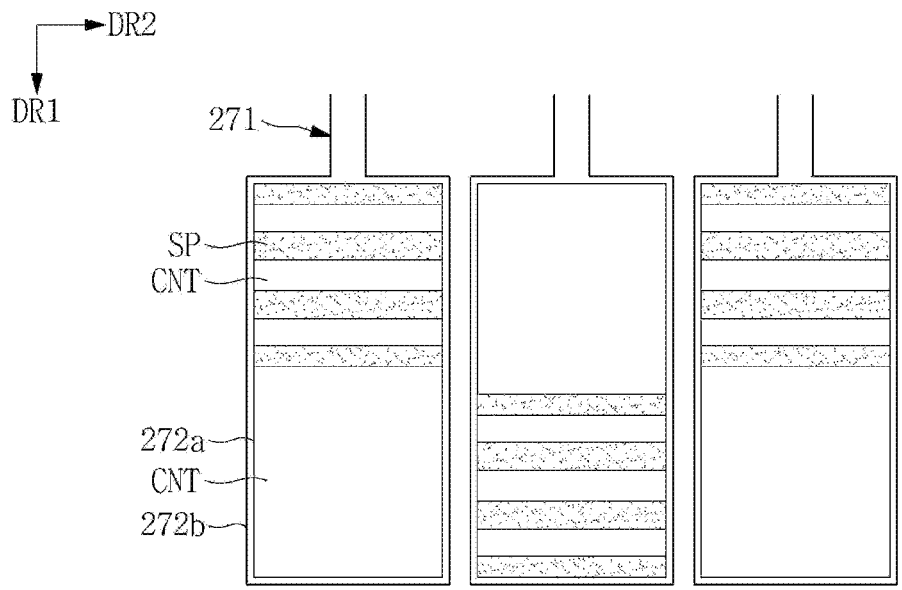
FIG. 6 is a plan view of conductive pads according to an alternative exemplary embodiment of the disclosure.

FIG. 6 is a plan view of conductive pads according to an exemplary embodiment of the disclosure.

Referring to FIG. 6, a plurality of protrusions 273 may be disposed on each of the first conductive pads 272a. In one exemplary embodiment, for example, the plurality of protrusions 273 may be spaced apart from each other with a substantially constant distance or substantially a same distance as each other. However, the exemplary embodiment of the disclosure is not limited thereto, and alternatively, the plurality of protrusions 273 may be spaced apart from each other with different distances.

According to an exemplary embodiment of the disclosure, the plurality of protrusions 273 adjacently disposed in a second direction DR2 may be disposed in a zigzag form based on a center line of the first conductive pads 272a adjacently disposed in the second direction DR2. In one exemplary embodiment, for example, the plurality of first conductive pads 272a may be disposed in the second direction DR2, and the plurality of protrusions 273 may be disposed in a zigzag form based on the center line of the first conductive pads 272a adjacently disposed in the second direction DR2. In such an embodiment, the center line of the first conductive pads 272a adjacently disposed in the second direction DR2 is an imaginary line which connects the first conductive pads 272a adjacently disposed in the second direction DR2. In such an embodiment, the plurality of protrusions 273 on two adjacent first conductive pads 272a in the second direction DR2 are disposed in opposite sides of the two adjacent first conductive pads 272a, respectively.

According to an exemplary embodiment of the disclosure, a plurality of raised portions SP may be disposed on each first conductive pad 272a. In such an embodiment, a plurality of protrusions 273 may be disposed on each first conductive pad 272a, and the second conductive pads 272b may be disposed on a plurality of protrusions 273, in a way such that portions of the second conductive pads 272b disposed on the protrusions 273 may in a way such that the raised portions SP.

According to an exemplary embodiment of the disclosure, as described above, a plurality of raised portions SP may be disposed in a zigzag form based on the center line of the first conductive pads 272a adjacently disposed in the second direction DR2. In one exemplary embodiment, for example, a plurality of first conductive pads 272a may be disposed in the second direction DR2, a plurality of raised portions SP may be disposed in a zigzag form based on the center line of the first conductive pads 272a adjacently disposed in the second direction DR2. Accordingly, the distance between the raised portions SP disposed on each first conductive pad 272a and raised portions SP disposed on another first conductive pad 272a adjacent in a first direction DR1 or second direction DR2 increases. Accordingly, when an anisotropic conductive film 310 is disposed between raised portions SP and bumps 254 to electrically connect the second conductive pads 272b and the bumps 254 to each other, possibility that a short circuit occurs between an adjacent second conductive pad 272b and bump 254 by the anisotropic conductive film 310 is reduced. Accordingly, in such an embodiment, the conductive pads 270 and the bumps 254 may be stably connected.

Hereinafter, other alternative exemplary embodiments of a display device according to the present disclosure will be described in detail below with reference to FIGS. 7 to 15. The same or like elements shown in FIGS. 7 to 15 have been labeled with the same reference characters as used above to describe the exemplary embodiments of the display device shown in FIGS. 1 to 5, and any repetitive detailed description thereof will hereinafter be omitted or simplified.

Figure 7:
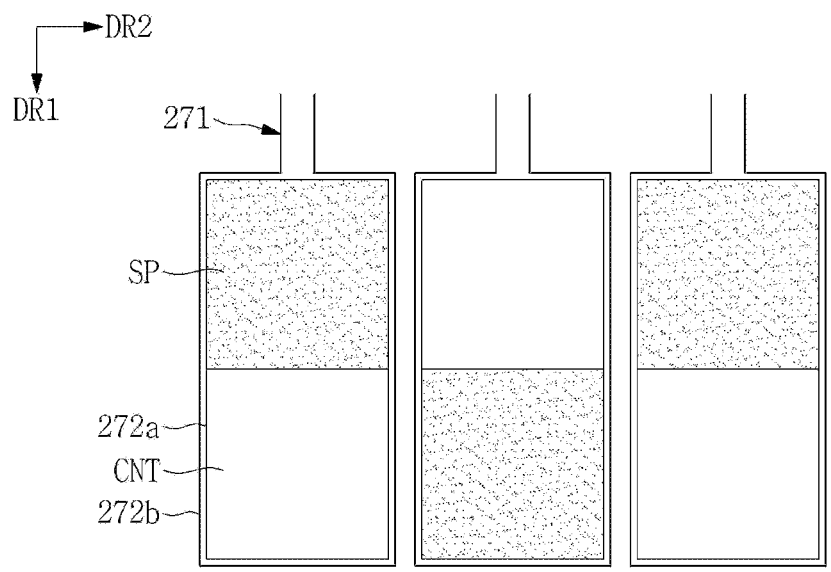
FIG. 7 is a plan view of conductive pads according to another alternative exemplary embodiment of the disclosure.
Figure 8:
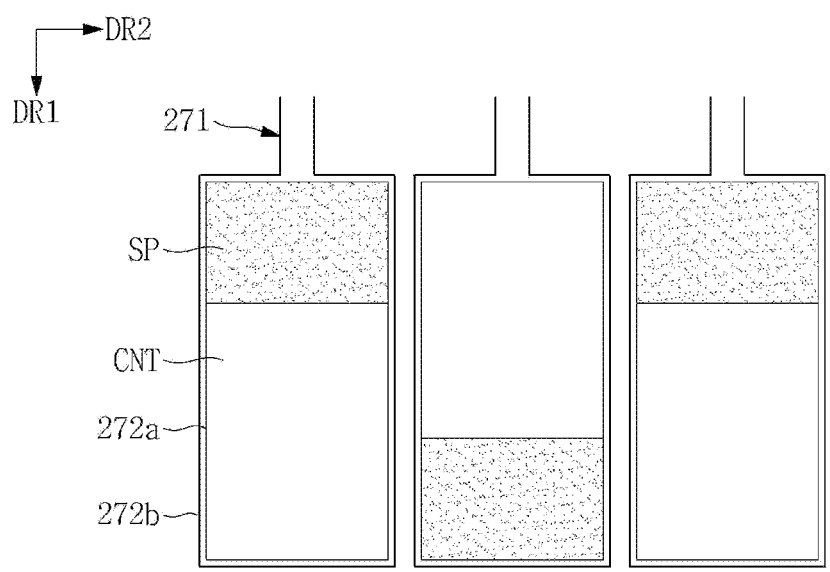
FIG. 8 is a plan view of conductive pads according to still another alternative exemplary embodiment of the disclosure.
Figure 9:
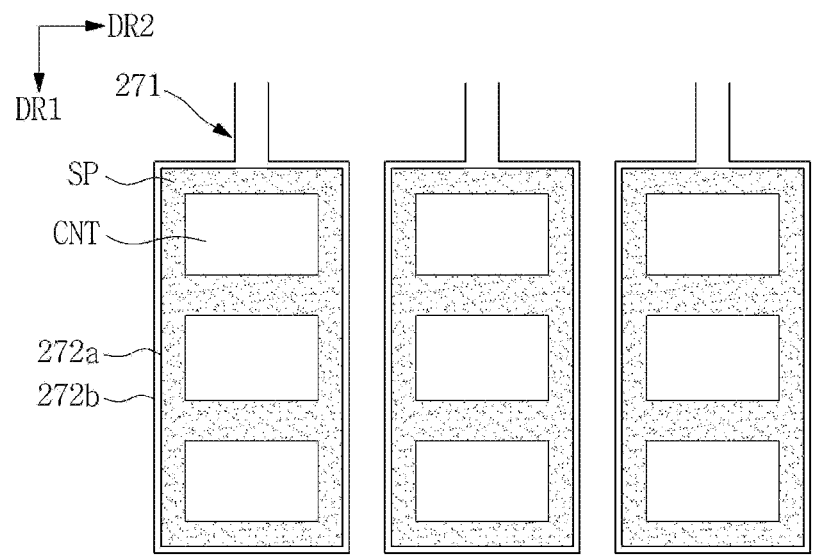
FIG. 9 is a plan view of conductive pads according to still another alternative exemplary embodiment of the disclosure.
Figure 10:
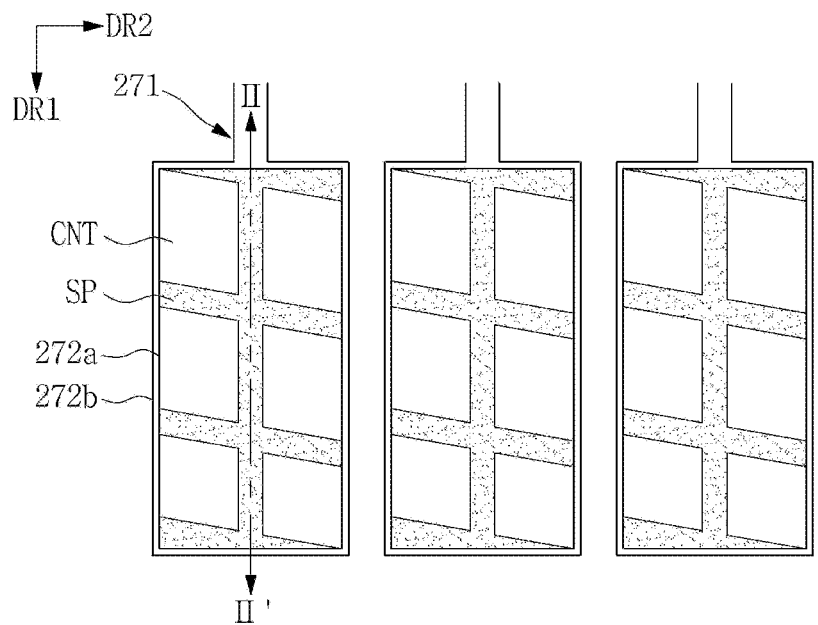
FIG. 10 is a plan view of conductive pads according to still another alternative exemplary embodiment of the disclosure.
Figure 11:
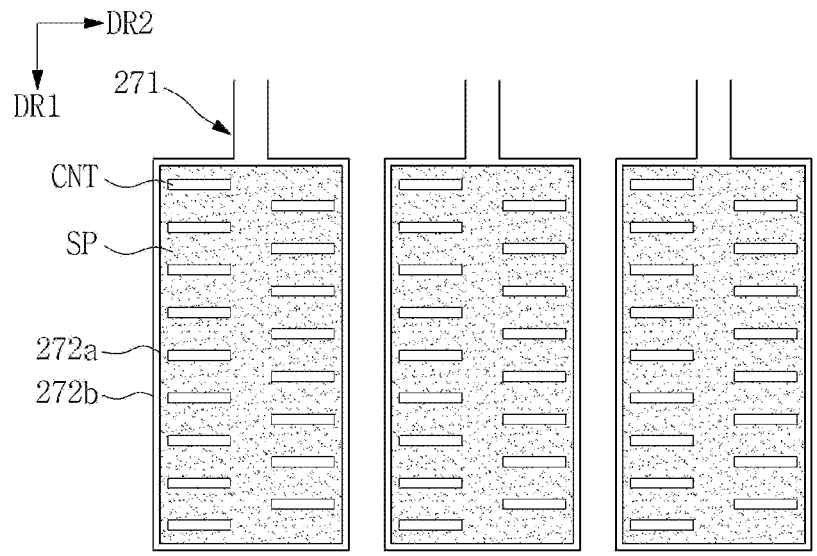
FIG. 11 is a plan view of conductive pads according to still another alternative exemplary embodiment of the disclosure.
Figure 12:
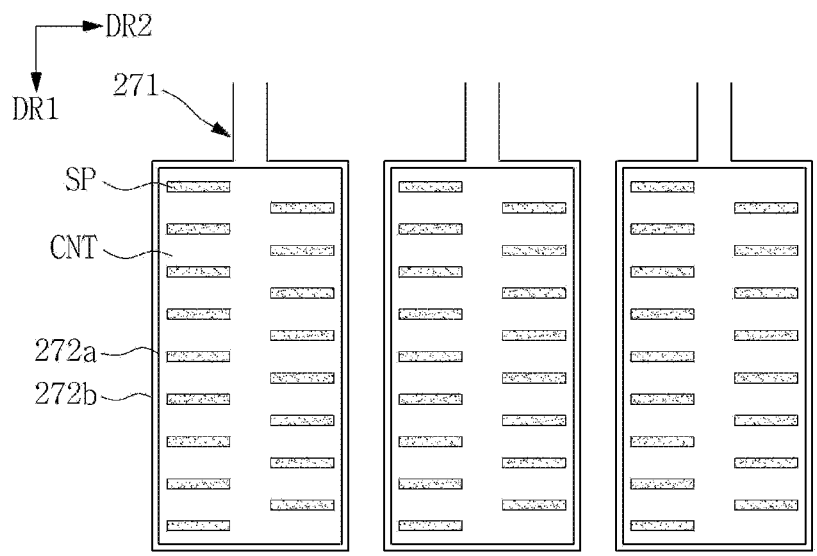
FIG. 12 is a plan view of conductive pads according to still another alternative exemplary embodiment of the disclosure.
Figure 13:
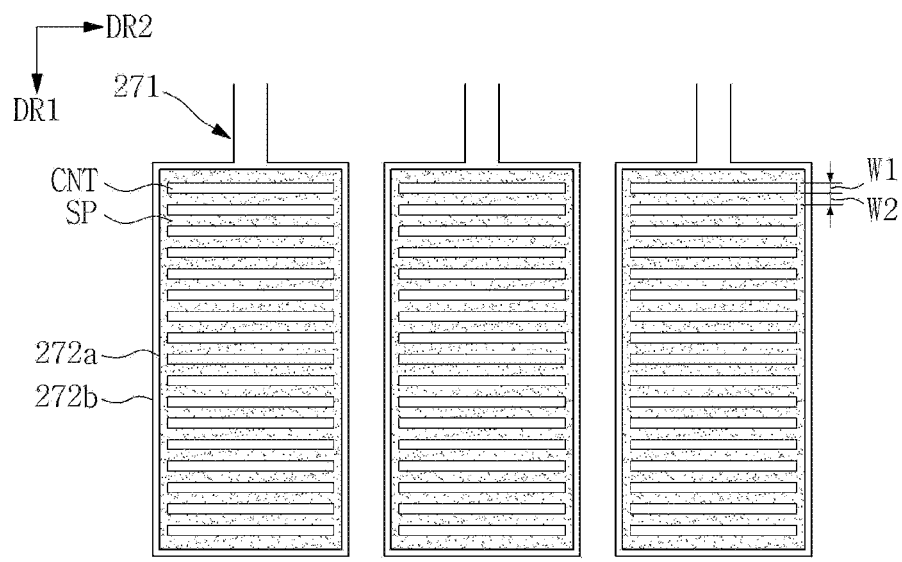
FIG. 13 is a plan view of conductive pads according to still another alternative exemplary embodiment of the disclosure.
Figure 14:
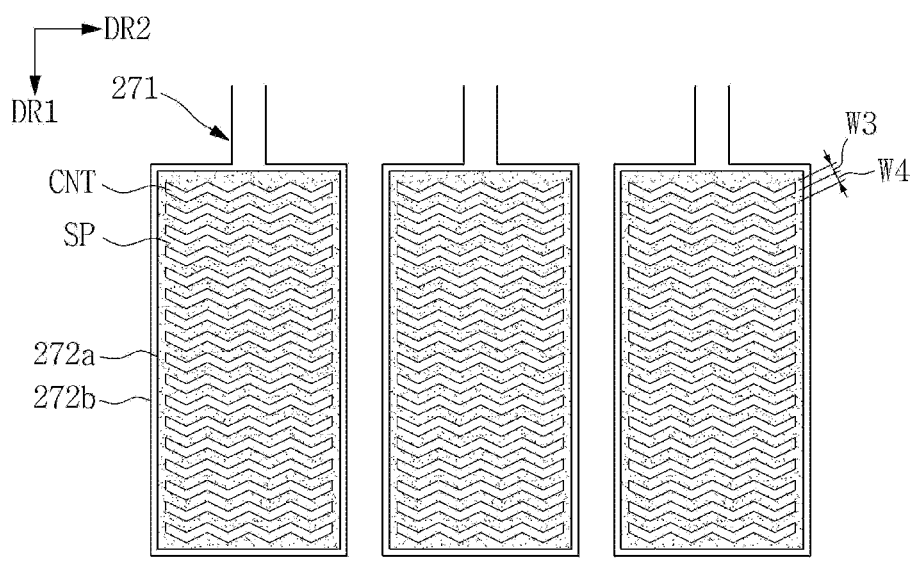
FIG. 14 is a plan view of conductive pads according to still another alternative exemplary embodiment of the disclosure.
Figure 15:
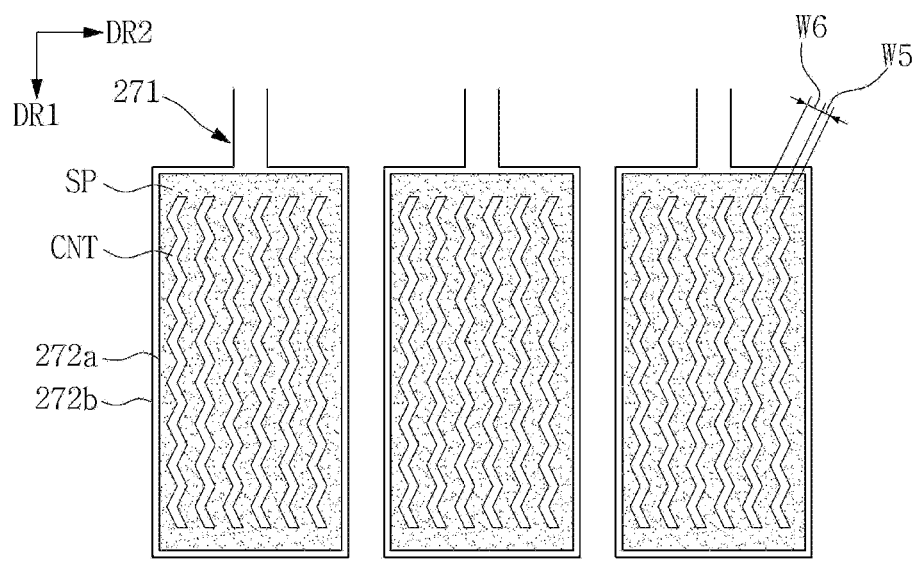
FIG. 15 is a plan view of conductive pads according to still another alternative exemplary embodiment of the disclosure.

FIG. 7 is a plan view of conductive pads according to an alternative exemplary embodiment of the disclosure, FIG. 8 is a plan view of conductive pads according to another alternative exemplary embodiment of the disclosure, FIG. 9 is a plan view of conductive pads according to still another alternative exemplary embodiment of the disclosure, FIG. 10 is a plan view of conductive pads according to still another alternative exemplary embodiment of the disclosure, FIG. 11 is a plan view of conductive pads according to still another alternative exemplary embodiment of the disclosure, FIG. 12 is a plan view of conductive pads according to still another alternative exemplary embodiment of the disclosure, FIG. 13 is a plan view of conductive pads according to still another alternative exemplary embodiment of the disclosure, FIG. 14 is a plan view of conductive pads according to still another alternative exemplary embodiment of the disclosure, and FIG. 15 is a plan view of conductive pads according to still another alternative exemplary embodiment of the disclosure.

Referring to FIGS. 7 and 8, each of the protrusions 273 may be disposed on a corresponding one of the first conductive pads 272a.

According to an exemplary embodiment of the disclosure, each of the protrusions 273 may have a total area equal to or less than ½ of the area of the corresponding one of the first conductive pads 272a, as shown in FIG. 7. However, the total area of each of the protrusions 273 is not limited thereto. According to an alternative exemplary embodiment of the disclosure, each of the protrusions 273 may have a total area equal to or less than ⅓ of the area of the corresponding one of the first conductive pads 272a, as shown in FIG. 8.

In an exemplary embodiment, as shown in FIG. 7, each of the raised portions SP may be disposed on a protrusion 273 having a total area equal to or less than ½ of the area of a first conductive pad 272a, and may have an area substantially equal to or less than ½ of the area of the first conductive pad 272a. However, the disposition and area of the raised portion SP are not limited thereto. In an alternative exemplary embodiment, as shown in FIG. 8, each raised portion SP may be disposed on a protrusion 273 having a total area equal to or less than ⅓ of the area of a first conductive pad 272a, and may have an area substantially equal to or less than ⅓ of the area of the first conductive pad 272a.

According to an exemplary embodiment of the disclosure, as shown in FIGS. 7 and 8, protrusions 273 may be disposed in a zigzag form based on the center line of first conductive pads 272a adjacently disposed in a second direction DR2. In one exemplary embodiment, for example, a plurality of first conductive pads 272a may be disposed in the second direction DR2, and the protrusions 273 may be disposed in a zigzag form based on the center line of the first conductive pads 272a adjacently disposed in the second direction DR2. Accordingly, the distance between a raised portion SP disposed on each first conductive pad 272a and another raised portion SP disposed on another first conductive pad 272a adjacent in a first direction DR1 or second direction DR2 increases. Accordingly, when an anisotropic conductive film 310 is disposed between raised portions SP and bumps 254 to electrically connect the second conductive pads 272b and the bumps 254 to each other, possibility that a short circuit occurs between an adjacent second conductive pad 272b and bump 254 by the anisotropic conductive film 310 is reduced, such that the conductive pads 270 and the bumps 254 may be stably connected.

According to an alternative exemplary embodiment of the disclosure, protrusions 273 disposed on each first conductive pad 272a may be integrated with each other, and thus raised portions SP disposed on the protrusions 273 may be integrated with each other when viewed from the plan view in the third direction DR3, as shown in FIGS. 9 and 10. In such an embodiment, raised portions SP disposed on a protrusions 273 extending in the first direction DR1 and the second direction DR2 may be integrated with each other when viewed from the plan view in the third direction DR3. In one exemplary embodiment, for example, as shown in FIG. 9, the protrusion 273 extending in the first direction DR1 is disposed on at least one end of each first conductive pad 272a, and thus raised portions SP are disposed at least one end of the first conductive pad 272a. Alternatively, as shown in FIG. 10, the protrusion 273 extending in the first direction DR1 is disposed along the center of the first conductive pad 272a in the first direction DR1, and thus the raised portions SP are disposed along the center of the first conductive pad 272a in the first direction DR1.

In an exemplary embodiment, referring to FIG. 10, the protrusions 273 and the raised portions SP may be disposed at a predetermined angle with respect to the first direction DR1 and the second direction DR2. However, the angle of the disposition of the protrusions 273 and the raised portions SP is not limited thereto, and alternatively, the protrusions 273 and the raised portions SP may be disposed parallel to the first direction DR1 or second direction DR2.

In another alternative exemplary embodiment, as shown in FIG. 11, the protrusions 273 and the raised portions SP may be integrated with each other. In such an embodiment, a plurality of contact portions CNT may be defined on a first conductive pad 272a, and the integrated protrusions 273 and raised portions SP may surround a plurality of contact portions CNT when viewed from the plan view in the third direction DR3.

In an exemplary embodiment, the plurality of contact portion CNT may be disposed in the first direction DR1 and the second direction DR2 on each of the first conductive pads 272a. In such an embodiment, the plurality of contact portions CNT may extend in the first direction DR1, and may be disposed in a zigzag form in the first direction DR1 based on an imaginary transverse center line extending in a lengthwise direction of the first conductive pad 272a. Accordingly, in such an embodiment, a crack occurring in the second conductive pads 272b may be effectively prevented from spreading to another area.

In another alternative exemplary embodiment, as shown in FIG. 12, contact portions CNT located on each of the first conductive pads 272a may be integrated with each other. In such an embodiment, a plurality of protrusions 273 and a plurality of raised portions SP may be located on each of the first conductive pads 272a, and the integrated contact portion CNT may surround the plurality of protrusions 273 and the plurality of raised portions SP when viewed from the plan view in the third direction DR3.

In such an embodiment, the plurality of protrusions 273 and the raised portions SP may be disposed in a first direction DR1 and a second direction DR2. In such an embodiment, the plurality of protrusions 273 and the plurality of raised portions SP may extend in the first direction DR1, and may be disposed in a zigzag form in the first direction DR1 based on an imaginary transverse center line extending in a lengthwise direction of the first conductive pad 272a. Accordingly, in such an embodiment, a crack which may occur in the second conductive pads 272b may be effectively prevented from spreading to another area.

In another alternative exemplary embodiment, as shown in FIG. 13, the protrusions 273 and the raised portions SP may be integrated with each other. In such an embodiment, a plurality of contact portions CNT may be located on each of the first conductive pads 272a, and the integrated protrusions 273 and raised portions SP may surround a plurality of contact portions CNT when viewed from the plan view in the third direction DR3.

In such an embodiment, the plurality of contact portions CNT may each have a width W1 substantially equal to or greater than about 1 micrometer (μm) and substantially equal to or less than about 5 μm with respect to the first direction DR1, and may be spaced apart from each other at intervals W2 substantially equal to or larger than about 1 μm and substantially equal to or less than about 5 μm with respect to the first direction DR1. In such an embodiment, the protrusions 273 and the raised portions SP may have a width W2 substantially equal to or greater than about 1 μm and substantially equal to or less than about 5 μm between the plurality of contact portions CNT with respect to the first direction DR1.

According to an exemplary embodiment of the disclosure, the plurality of contact portions CNT may be densely disposed to have a smaller width, and a crack which may occur in the second conductive pads 272b may be effectively prevented.

In other alternative exemplary embodiments, as shown in FIGS. 14 and 15, protrusions 273 and raised portions SP may be integrated with each other. In such an embodiment, a plurality of contact portions CNT may be located on each of the first conductive pads 272a, and integrated protrusions 273 and raised portions SP may surround the plurality of contact portions CNT when viewed from the plan view in the third direction DR3.

In such an embodiment, each of the plurality of contact portions CNT may have a zigzag shape extending in a second direction DR2, as shown in FIG. 14, or may have a zigzag shape extending in a first direction DR1, as shown in FIG. 15.

In such an embodiment, the plurality of contact portions CNT may have a width W3 or W5 substantially equal to or greater than about 1 μm and substantially equal to or less than about 5 and may be spaced apart from each other at intervals W4 or W6 substantially equal to or greater than about 1 μm and substantially equal to or less than about 5 In other words, the protrusions 273 and the raised portions SP may have a width W4 or W6 substantially equal to or greater than about 1 μm and substantially equal to or less than about 5 μm between the plurality of contact portions CNT.

According to an exemplary embodiment of the disclosure, the plurality of contact portions CNT are densely disposed to have a smaller width, and a crack which may occur in the second conductive pads 272b may be effectively prevented.

Exemplary embodiments of a display device, onto each of which circuit members are bonded, will hereinafter be described in detail with reference to FIGS. 16 to 19.

Figure 16:
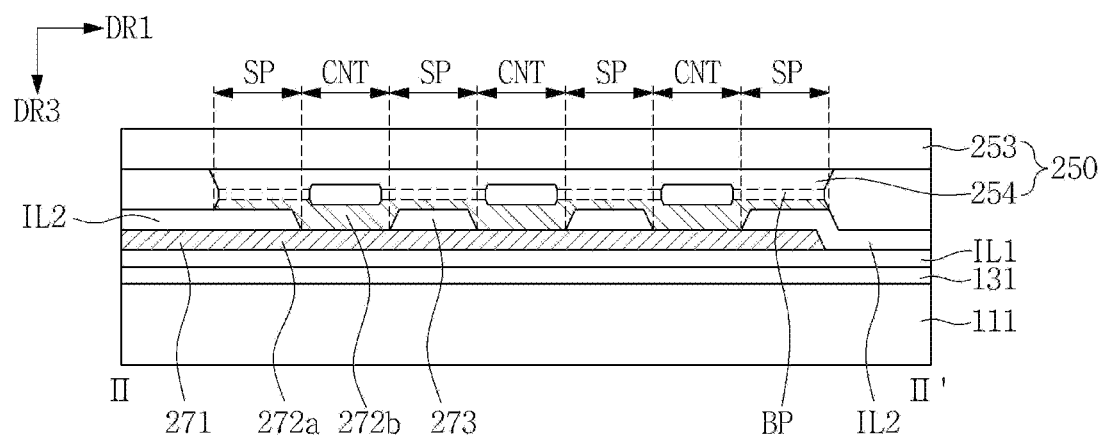
FIG. 16 is a cross-sectional view of a display device according to an exemplary embodiment of the disclosure, onto which circuit members are bonded.
Figure 17:
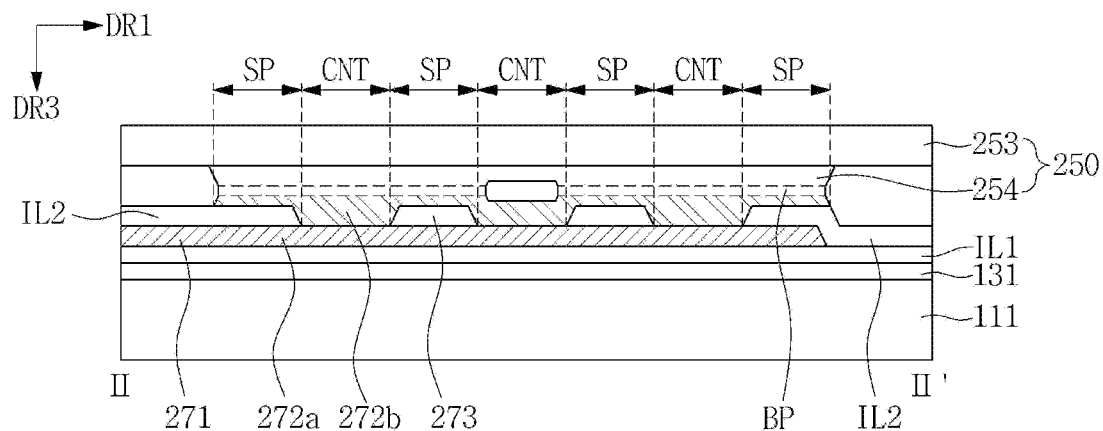
FIG. 17 is a cross-sectional view of a display device according to an alternative exemplary embodiment of the disclosure, onto which circuit members are bonded.
Figure 18:
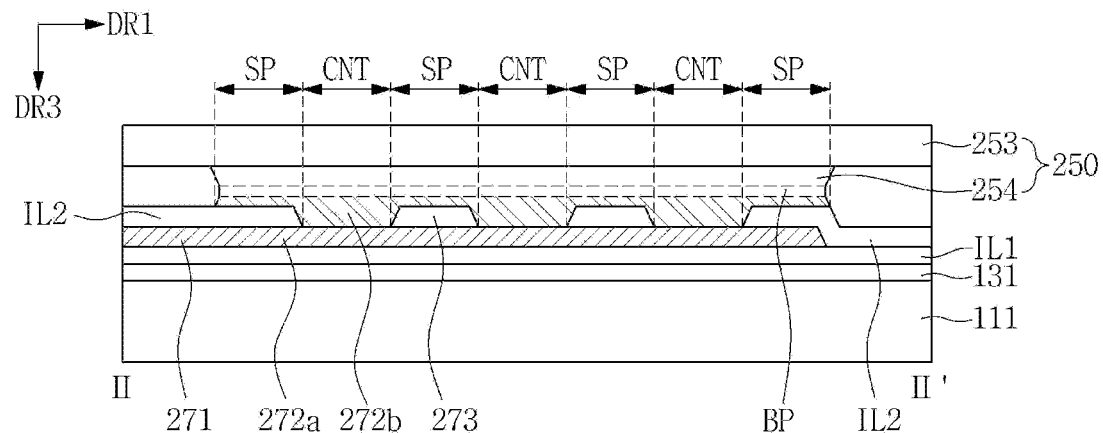
FIG. 18 is a cross-sectional view of a display device according to another alternative exemplary embodiment of the disclosure, onto which circuit members are bonded.
Figure 19:
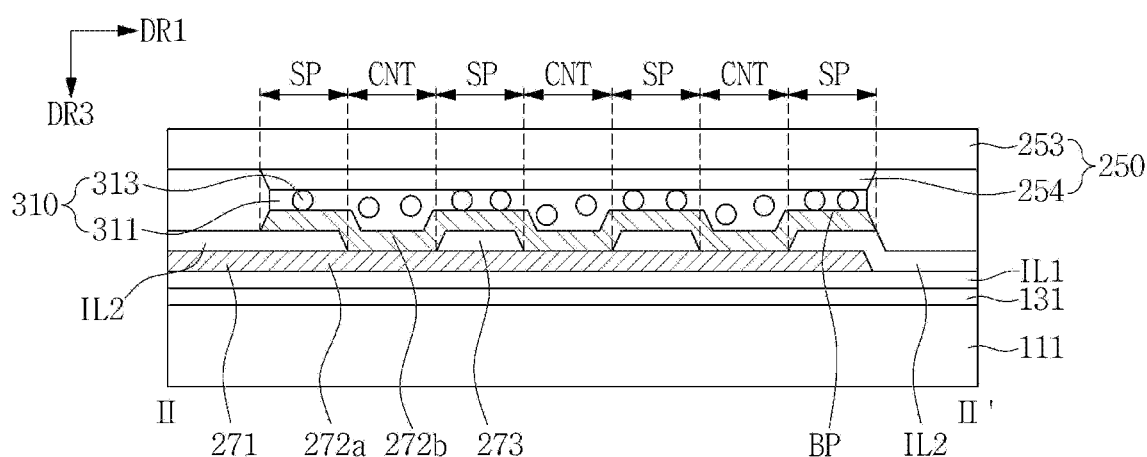
FIG. 19 is a cross-sectional view of a display device according to still another alternative exemplary embodiment of the disclosure, onto which circuit members are bonded.

FIG. 16 is a cross-sectional view of a display device according to an exemplary embodiment of the disclosure, onto which circuit members are bonded, FIG. 17 is a cross-sectional view of a display device according to an alternative embodiment of the disclosure, onto which circuit members are bonded, FIG. 18 is a cross-sectional view of a display device according to another alternative exemplary embodiment of the disclosure, onto which circuit members are bonded, and FIG. 19 is a cross-sectional view of a display device according to still another alternative exemplary embodiment of the disclosure, onto which circuit members are bonded.

Referring to FIGS. 16 to 18, an exemplary embodiment of a display device includes circuit members 250. The circuit members 250 include a body portion 253 and a bump 254.

The body portion 253 may include a circuit wiring, and the bump 254 may include a conductive material to connect the body portion 253 and the pad wiring 270 of the display device to each other. In an exemplary embodiment, the bump 254 may include a material which may be ultrasonically bonded.

According to an exemplary embodiment of the disclosure, the circuit members 250 may be bonded onto a substrate 111 by ultrasonic bonding. In such an embodiment, the ultrasonic bonding is a process in which frictional heat is generated between a metal and a bonding target surface by applying mechanical vibration energy in an ultrasonic frequency band, together with pressure, onto the metal to be bonded, the surface of the metal instantaneously reaches a plastic deformation temperature, and the particles of the metal and the surface in contact with each other are bonded together by the frictional heat. The metal bonded by ultrasonic bonding is bonded by molecular bonding, and thus the strength and electrical conductivity thereof are high. Furthermore, the ultrasonic bonding may effectively bond different types of metals together.

According to an exemplary embodiment of the disclosure, at least a part of the conductive pads 270 is bonded onto the bump 254 of the circuit members 250. In such an embodiment, as shown in FIG. 16, the raised portions SP of second conductive pads 272b are bonded onto the bump 254 of the circuit member 250, and form bonded portions BP. In an exemplary embodiment, frictional heat is generated between the surfaces of the raised portions SP and the bump 254 by ultrasonic bonding, and the surfaces of the raised portions SP and the bump 254 are melted and bonded together by the frictional heat, thereby forming the bonded portions BP. Accordingly, the bonded portions BP include both a material constituting the first conductive pad 272a and a material constituting the second conductive pads 272b. In such an embodiment, as shown in FIG. 16, the contact portions CNT may not be bonded onto the bump 254, and thus holes defined by the contact portions CNT, the bump 254 and the bonded portions BP may be formed.

Referring to FIGS. 16 to 18, raised portions SP, which overlap the first conductive pad 272a and protrusions 273, are bonded onto the bump 254 of the circuit members 250. In an exemplary embodiment, the surfaces of the raised portions SP in contact with the bump 254 of the circuit members 250 are melted and bonded onto the bump 254 of the circuit members 250 by frictional heat resulting from ultrasonic bonding, and the bonded portions BP are formed between the raised portions SP and the bump 254. Accordingly, in such an embodiment, the raised portions SP, the bump 254 and the bonded portions BP are integrated with one another.

In such an embodiment, the surfaces of the raised portions SP in contact with the bump 254 of the circuit members 250 may be melted by frictional heat resulting from ultrasonic bonding, and may exhibit a color different from that of a portion in which frictional heat is not generated. In such an embodiment, portions of the bonded portions BP which overlap the protrusions 273 or raised portions SP may exhibit a color different from portions which do not overlap the protrusions 273 or raised portions SP.

The second conductive pads 272b are bonded onto the bump 254 of the circuit members 250 in an area substantially equal to or greater than about 100 $\mu m^2$.

In an alternative exemplary embodiment, as shown in FIG. 17, at least one of the contact portions CNT may be bonded onto the bump 254 of the circuit members 250. In such an embodiment, the surfaces of the raised portions SP in contact with the bump 254 of the circuit members 250 are melted and flow onto the contact portion CNT by frictional heat resulting from ultrasonic bonding, and thus at least one of the contact portions CNT, together with the raised portions SP, is bonded onto the bump 254. Accordingly, the bonded portions BP are formed between the raised portions SP and the bump 254, and the raised portions SP, the bump 254 and the bonded portions BP are integrated with one another. In such an embodiment, as shown in FIG. 17, at least a part of the contact portions CNT may not be bonded onto the bump 254, and thus holes defined by the contact portion CNT, the bump 254 and the bonded portions BP may be formed. Alternatively, as shown in FIG. 18, all of the contact portions CNT, together with the raised portions SP, may be bonded onto the bump 254 of the circuit member 250. In such an embodiment, the front surfaces of the second conductive pads 272b may be bonded onto the bump 254 of the circuit members 250.

In an alternative exemplary embodiment, as shown in FIG. 19, a display device may further include an anisotropic conductive film 310.

The anisotropic conductive film 310 may be disposed between circuit members 250 and conductive pads 271, and may electrically connect the circuit members 250 and the conductive pads 271 to each other.

The anisotropic conductive film 310 includes a base portion 311 and conductive particles 313 dispersed in the base portion 311. During the process of bonding conductive pads 270 and a bump 254 to each other, when the anisotropic conductive film 310 is pressed and heated, the conductive particles 313 are compressed and melted, and thus a stable electric contact is provided between the conductive pads 270 and the bump 254.

Figure 20:
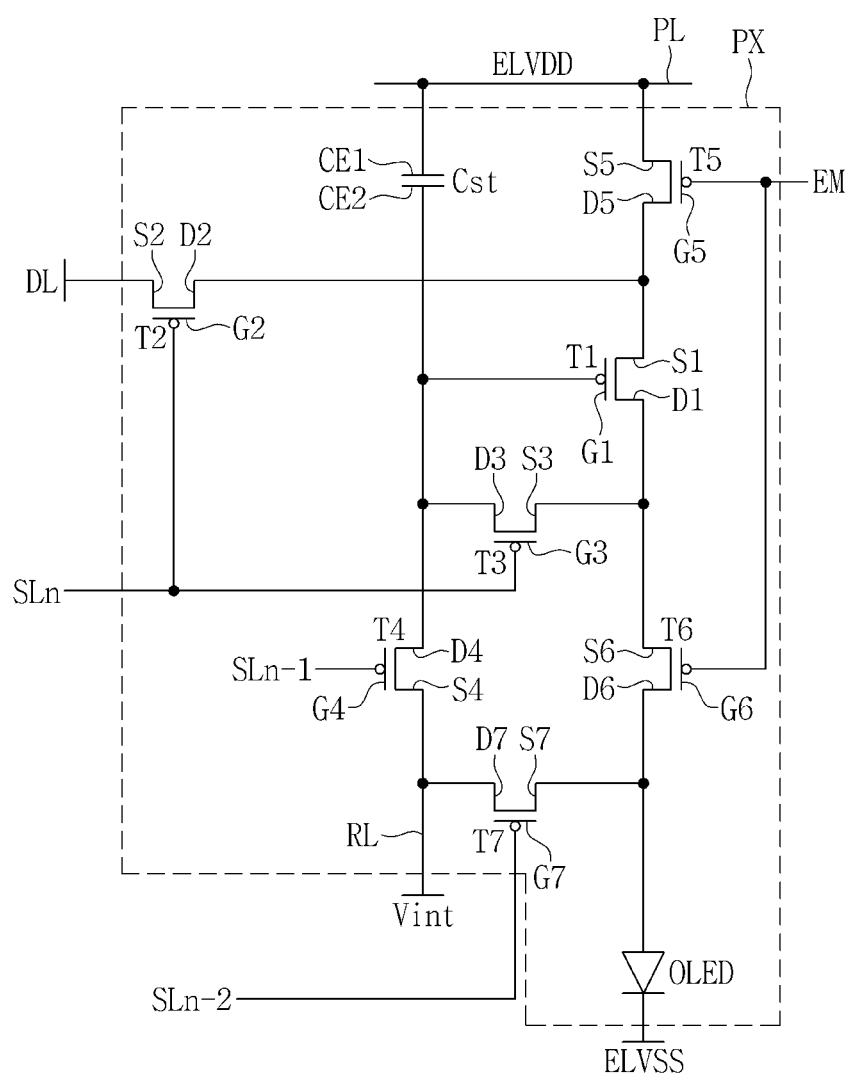
FIG. 20 is a circuit diagram of a pixel of a display device according to an exemplary embodiment of the disclosure.
Figure 22:
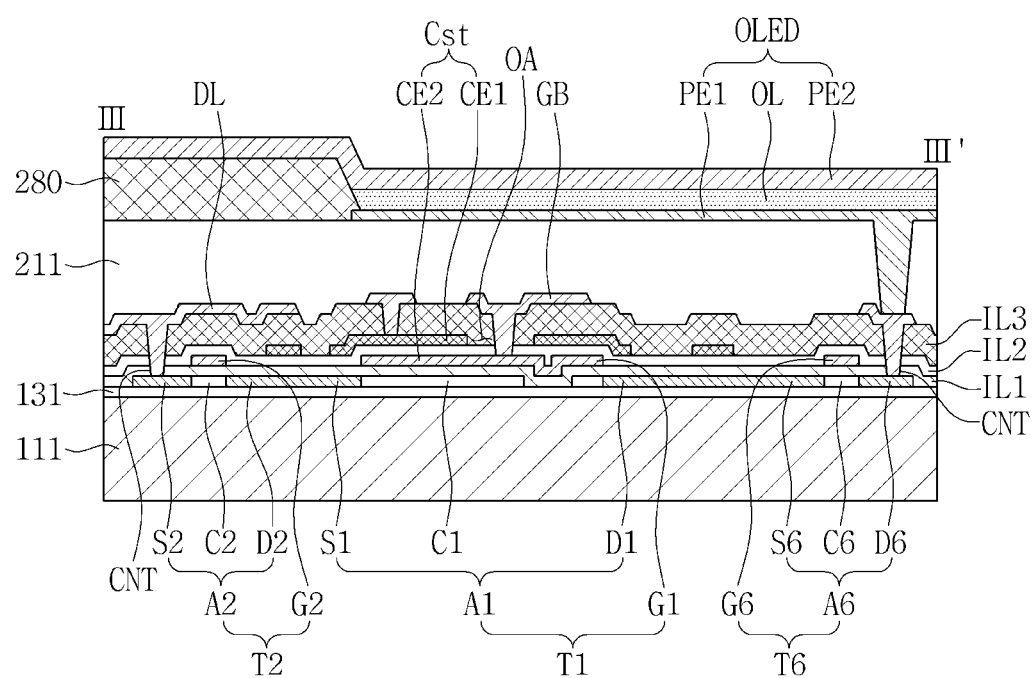
FIG. 22 is a cross-sectional view taken along line of FIG. 21.

FIG. 20 is a circuit diagram of a pixel of a display device according to an exemplary embodiment of the disclosure, FIG. 21 is a plan view of the pixel of the display device according to an exemplary embodiment of the disclosure, and FIG. 22 is a cross-sectional view taken along line of FIG. 21.

In an exemplary embodiment of a pixel PX, as shown in FIGS. 20 to 22, first to seventh thin film transistors T1 to T7 are located on a substrate 111, and include first to seventh active layers A1 to A7 and first to seventh gate electrodes G1 to G7.

The first to seventh active layers A1 to A7 include first to seventh source electrodes S1 to S7, first to seventh channels C1 to C7, and first to seventh drain electrodes D1 to D7. Each of the first to seventh active layers A1 to A7 includes polysilicon or an oxide semiconductor. The oxide semiconductor may include at least one selected from oxides including titanium (Ti), hafnium (Hf), zirconium (Zr), aluminum (Al), tantalum (Ta), germanium (Ge), zinc (Zn), gallium (Ga), tin (SLn), or indium (In), and composite oxides thereof including zinc oxide (ZnO), indium-gallium-zinc oxide (In-GaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). In an exemplary embodiment, where the first active layer A1 includes an oxide semiconductor, a separate protective layer may be added to protect the oxide semiconductor from an external environment, such as a high temperature.

The first to seventh active layers A1 to A7 may include a same material as each other, may be integrated with one another, and may be connected to one another.

The first to seventh channels C1 to C7 of the first to seventh active layers A1 to A7 may be doped with an n-type dopant or p-type dopant. The first to seventh source electrodes S1 to S7 and the first to seventh drain electrodes D1 to D7 may be spaced apart from each other with the first to seventh channel C1 to C7 disposed therebetween, and may be doped with a dopant of the type opposite to the type of dopant with which the first to seventh channels C1 to C7 are doped.

The first to seventh gate electrodes G1 to G7, the first to seventh source electrodes S1 to S7, and the first to seventh drain electrodes D1 to D7 may be connected to each other by a contact hole and a gate bridge GB, and may be connected to first to third gate lines SLn, SLn-1 and SLn-2, a light-emission control line EM, a capacitor Cst, a data line DL, a common power line PL, a reset line RL, and an organic light-emitting diode OLED.

The first to seventh gate electrodes G1 to G7 may be located on the first to seventh channels C1 to C7 of the first to seventh active layers A1 to A7, respectively.

The first insulating layer ILL the second insulating layer IL2 and the third insulating layer IL3 are sequentially stacked on the first active layer A1, the second active layer A2, the third active layer A3, the fourth active layer A4, the fifth active layer A5, the sixth active layer A6 and the seventh active layer A7. Each of the first insulating layer ILL the second insulating layer IL2 and the third insulating layer IL3 may be an inorganic insulating layer or organic insulating layer, such as silicon nitride or silicon oxide. In such an embodiment, each of the insulating layers may have a single-layer structure or a multi-layer structure. The above-described plurality of contact holes CNT are selectively defined or formed on each of the first insulating layer ILL the second insulating layer IL2, and the third insulating layer IL3. The first insulating layer IL1 is in contact with each of the first active layer A1, the second active layer A2, the third active layer A3, the fourth active layer A4, the fifth active layer A5, the sixth active layer A6 and the seventh active layer A7.

The first gate line SLn is located on the second active layer A2 and the third active layer A3, extends in a direction intersecting the second active layer A2 and the third active layer A3, is integrated with the second gate electrode G2 and the third gate electrode G3, and is connected to the second gate electrode G2 and the third gate electrode G3.

The second gate line SLn-1 is spaced apart from the first gate line SLn, is located on the fourth active layer A4, extends in a direction intersecting the fourth active layer A4, is integrated with the fourth gate electrode G4, and is connected to the fourth gate electrode G4.

The third gate line SLn-2 is spaced apart from the second gate line SLn-1, is located on the seventh active layer A7, extends in a direction intersecting the seventh active layer A7, is integrated with the seventh gate electrode G7, and is connected to the seventh gate electrode G7.

The light-emission control line EM is spaced apart from the first gate line SLn, is located on the fifth active layer A5 and the sixth active layer A6, extends in a direction intersecting the fifth active layer A5 and the sixth active layer A6, is integrated with the fifth gate electrode G5 and the sixth gate electrode G6, and is connected to the fifth gate electrode G5 and the sixth gate electrode G6.

The above-described light-emission control line EM, third gate line SLn-2, second gate line SLn-1, first gate line SLn, first gate electrode G1, second gate electrode G2, third gate electrode G3, fourth gate electrode G4, fifth gate electrode G5, sixth gate electrode G6, and seventh gate electrode G7 are located in the same layer, and include the same material. However, the exemplary embodiment of the disclosure is not limited thereto. Alternatively, the light-emission control line EM, the third gate line SLn-2, the second gate line SLn-1, the first gate line SLn, the first gate electrode G1, the second gate electrode G2, the third gate electrode G3, the fourth gate electrode G4, the fifth gate electrode G5, the sixth gate electrode G6 and the seventh gate electrode G7 may be selectively located in different layers from each other, and may include different materials from each other.

The capacitor Cst includes one electrode CE1 and the other electrode CE2 opposite to each other with an insulating layer interposed therebetween. In an exemplary embodiment, the other electrode CE2 may be the first gate electrode G1. The one electrode CE1 of the capacitor is located on the first gate electrode G1, and is connected to the common power line PL for transferring a first power source ELVDD through a contact hole.

The one electrode CE1 of the capacitor may form the capacitor Cst in conjunction with the first gate electrode G1, and the first gate electrode G1 and the one electrode CE1 of the capacitor may be disposed in different layers from each other and may include different metals from each other or a same metal.

The electrode CE1 of the capacitor defines an opening OA configured to expose a portion of the first gate electrode G1, and the gate bridge GB is connected to the first gate electrode G1 through the opening OA.

The data line DL is located on the first gate line SLn, extends in a direction intersecting the first gate line SLn, and is connected to the second source electrode S2 of the second active layer A2 through the contact hole CNT. The data line DL extends across the first gate line SLn, the second gate line SLn-1, the third gate line SLn-2, and the light-emission control line EM.

The gate bridge GB is located on the first gate line SLn, is spaced apart from the common power line PL, and is connected to the third drain electrode D3 of the third active layer A3 and the fourth drain electrode D4 of the fourth active layer A4 through the contact hole CNT. In such an embodiment, the gate bridge GB is connected to the first gate electrode G1.

The common power line PL is spaced apart from the data line DL, is located on the first gate line SLn, and extends in a direction intersecting the first gate line SLn. In other words, the common power line PL extends across the first gate line SLn, the second gate line SLn-1, the third gate line SLn-2, and the light-emission control line EM.

The common power line PL is connected to one end of the organic light-emitting diode OLED through at least one thin film transistor. The other end of the organic light-emitting diode OLED is connected to a second power source ELVSS. The common power line PL is connected to the one electrode CE1 of the capacitor Cst and the fifth source electrode S5 of the fifth active layer A5 connected to the first active layer A1 through the contact hole CNT.

An organic film 211 is disposed on the common power line PL. The organic film 211 functions as an insulating film and a planarization film.

The above-described data line DL, the above-described common power line PL, and the above-described gate bridge GB are located in a same layer as each other, and include a same material as each other. In an alternative exemplary embodiment of the disclosure, the above-described common power line PL, and the above-described gate bridge GB may be located in different layers from each other, and may include different materials from each other.

The reset line RL is located on the second gate line SLn-1, and the fourth source electrode S4 of the fourth active layer A4 is connected to the reset ling RL through a contact hole to receive a reset voltage Vint. The reset line RL is located in a same layer as the first electrode PE1 of the organic light-emitting diode OLED, and may include a same material as each other. In an alternative exemplary embodiment of the disclosure, the reset line RL may be located in a layer different from a layer in which the first electrode PE1 is located, and may include different materials from that of the first electrode PE1.

A pixel defining film 280 is disposed on the organic film 211, an opening is defined therethrough, and the first electrode PE1 of the organic light-emitting diode OLED is exposed from the pixel defining film 280 through the opening. The pixel defining film 280 may define the light-emission area of the organic light-emitting diode OLED.

The organic light-emitting diode OLED includes a first electrode PE1, an organic light-emission layer OL, and a second electrode PE2. The first electrode PE1 is connected to the sixth drain electrode D6 of the sixth thin film transistor T6 through the contact hole CNT. The organic light-emission layer OL is located between the first electrode PE1 and the second electrode PE2. The second electrode PE2 is located on the organic light-emission layer OL. One of the first electrode PE1 and the second electrode PE2 may have optical transparency. Light emitted from the organic light-emission layer OL is emitted in the direction of any one of the first electrode PE1 and the second electrode PE2.

Although not shown in the drawing, in an exemplary embodiment, a capping layer configured to cover the organic light-emitting diode OLED may be disposed on the organic light-emitting diode OLED. Alternatively, a thin film encapsulation layer or encapsulation substrate may be disposed on the organic light-emitting diode OLED.

Herein, for convenience of description, exemplary embodiment, where the display device is an organic light-emitting diode display device are described in detail, but not being limited thereto. In one alternative exemplary embodiment, for example, the display device may be a liquid crystal display device, an electrophoretic display device, etc.

According to an exemplary embodiment of the disclosure, a circuit member may be stably bonded onto a display substrate by ultrasonic bonding or an anisotropic conductive film ("ACF").

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
   a substrate comprising a pad area;
   a plurality of first conductive pads disposed in a matrix form in the pad area in a first direction and in a second direction intersecting the first direction;
   protrusions disposed on the plurality of first conductive pads; and
   a plurality of second conductive pads disposed on the plurality of first conductive pads and the protrusions;
   wherein the plurality of second conductive pads comprises:
      contact portions in contact with the first conductive pads; and
      raised portions extending from the contact portions, wherein the raised portions cover the protrusions, and have a height greater than a height of the contact portions; and
   wherein the plurality of second conductive pads comprise an ultrasonic bondable material.

2. The display device of claim 1, wherein the plurality of second conductive pads comprise at least one selected from aluminum (Al), silver (Ag), copper (Cu), molybdenum (Mo), chrome (Cr), tantalum (Ta), and titanium (Ti).

3. The display device of claim 1, wherein the raised portions have an area substantially equal to or larger than about 100 μm² when viewed from a plan view in a thickness direction of the substrate.

4. The display device of claim 1, wherein the second conductive pads have a thickness of about 6000 Å or greater.

5. The display device of claim 1, wherein the first conductive pads are spaced apart from each other by a distance substantially equal to or longer than about 15 μm.

6. The display device of claim 1, wherein the second conductive pads are spaced apart from each other by a distance substantially equal to or longer than about 15 μm.

7. The display device of claim 1, wherein the first conductive pads comprise at least one selected from aluminum (Al), silver (Ag), copper (Cu), molybdenum (Mo), chrome (Cr), tantalum (Ta), and titanium (Ti).

8. The display device of claim 1, wherein the substrate comprises:
   gate lines extending in the first direction;
   a gate insulating film disposed on the gate lines; and
   data lines disposed on the gate insulating film, and extending in the second direction;
   wherein the first conductive pads comprise a same material as the gate lines;
   wherein the protrusions comprise a same material as the gate insulating film; and
   wherein the second conductive pads comprise a same material as the data lines.

9. The display device of claim 1, wherein the plurality of second conductive pads is disposed in a zigzag form based on a center line of the plurality of first conductive pads adjacently disposed in the second direction.

10. The display device of claim 1, wherein the plurality of second conductive pads disposed on one of the plurality of first conductive pads are spaced apart from each other in the first direction.

11. The display device of claim 1, wherein the raised portions have a total area equal to or less than ½ of an area of the first conductive pads when viewed from a plan view in a thickness direction of the substrate.

12. The display device of claim 1, wherein the raised portions have a total area equal to or less than ⅓ of an area of the first conductive pads when viewed from a plan view in a thickness direction of the substrate.

13. The display device of claim 1, wherein holes are defined by the protrusions.

14. The display device of claim 1, wherein at least a part of the protrusions is disposed at a predetermined angle with the first direction when viewed from a plan view in a thickness direction of the substrate.

15. The display device of claim 1, wherein the protrusions disposed on one of the plurality of first conductive pads are integrated with each other.

16. The display device of claim 1, wherein the contact portions are surrounded by the protrusions and the raised portions when viewed from a plan view in a thickness direction of the substrate.

17. The display device of claim 1, wherein the protrusions and raised portions are surrounded by the contact portions when viewed from a plan view in a thickness direction of the substrate.

18. The display device of claim 1, wherein the contact portions extend in a zigzag form in the second direction.

19. The display device of claim 1, wherein the contact portions extend in a zigzag form in the first direction.

20. The display device of claim 1, wherein the contact portions have a width substantially equal to or larger than about 1 μm and substantially equal to or less than about 5 μm.

21. The display device of claim 1, wherein
   the contact portions comprises a first contact portion and a second contact portion adjacent to each other, and the first contact portion is spaced apart from the second contact portion by a distance substantially equal to or greater than about 1 μm and substantially equal to or less than about 5 μm when viewed from a plan view in a thickness direction of the substrate.

* * * * *